United States Patent [19]
Os et al.

[11] Patent Number: 5,838,528
[45] Date of Patent: *Nov. 17, 1998

[54] ELECTROSTATIC CHUCK ASSEMBLY

[75] Inventors: Ron van Os, Sunnyvale; Eric D. Ross, Santa Cruz, both of Calif.

[73] Assignee: Watkins-Johnson Company, Palo Alto, Calif.

[*] Notice: The term of this patent shall not extend beyond the expiration date of Pat. No. 5,708,556.

[21] Appl. No.: 883,366

[22] Filed: Jun. 26, 1997

Related U.S. Application Data

[63] Continuation of Ser. No. 500,480, Jul. 10, 1995, Pat. No. 5,708,556.

[51] Int. Cl.$^6$ .................................................. H02N 13/00
[52] U.S. Cl. .......................................... 361/234; 279/128
[58] Field of Search ............................ 361/234; 279/128

[56] References Cited

U.S. PATENT DOCUMENTS

| | | | |
|---|---|---|---|
| 4,431,473 | 2/1984 | Okano et al. | 156/345 |
| 4,565,601 | 1/1986 | Kakehi et al. | 156/345 |
| 5,382,311 | 1/1995 | Ishikawa et al. | 156/345 |
| 5,452,510 | 9/1995 | Barnes et al. | 29/825 |
| 5,708,556 | 1/1998 | Van Os et al. | 361/234 |

FOREIGN PATENT DOCUMENTS

| | | | |
|---|---|---|---|
| 52-69578 | 9/1977 | Japan | H01L 21/68 |
| 6-22213 | 6/1985 | Japan . | |
| 62-277235 | 5/1986 | Japan . | |
| 62-120931 | 6/1987 | Japan | B32Q 3/15 |
| 01-310554 | 12/1989 | Japan | H01L 21/68 |
| 02-256256 | 10/1990 | Japan | H01L 21/68 |
| 03-102820 | 4/1991 | Japan | H01L 21/302 |
| 04-192347 | 10/1992 | Japan | H01L 21/68 |
| 04-372152 | 12/1992 | Japan | H01L 21/68 |
| 05-175318 | 7/1993 | Japan | H01L 21/68 |
| 06-177078 | 6/1994 | Japan | H01L 21/302 |
| 06-252253 | 9/1994 | Japan | H01L 21/68 |
| 06-302678 | 10/1994 | Japan | H01L 21/68 |
| 07-130825 | 5/1995 | Japan | H01L 21/68 |

*Primary Examiner*—Fritz Fleming
*Attorney, Agent, or Firm*—Flehr Hohbach Test Albritton & Herbert LLP

[57] ABSTRACT

An electrostatic support system for retaining a wafer. The support system generally includes a support body having a support surface for retaining said wafer, a voltage source coupled to the support body for electrostatically coupling the wafer to the support surface, and a cooling system for cooling the wafer. A plurality of arm members extend from the support body to a carriage assembly for releasably mounting the support body to the processing chamber with the support body and the arm members separated from the chamber floor. This invention also includes the method of supporting a wafer in a processing chamber which includes the steps of positioning the wafer on a wafer supporting surface, applying a voltage to an electrode assembly to electrostatically attract the wafer to the support surface and, after processing the wafer, substantially grounding the electrode assembly to sufficiently deactivate the electrostatic charge for release of the wafer from the support surface.

13 Claims, 9 Drawing Sheets

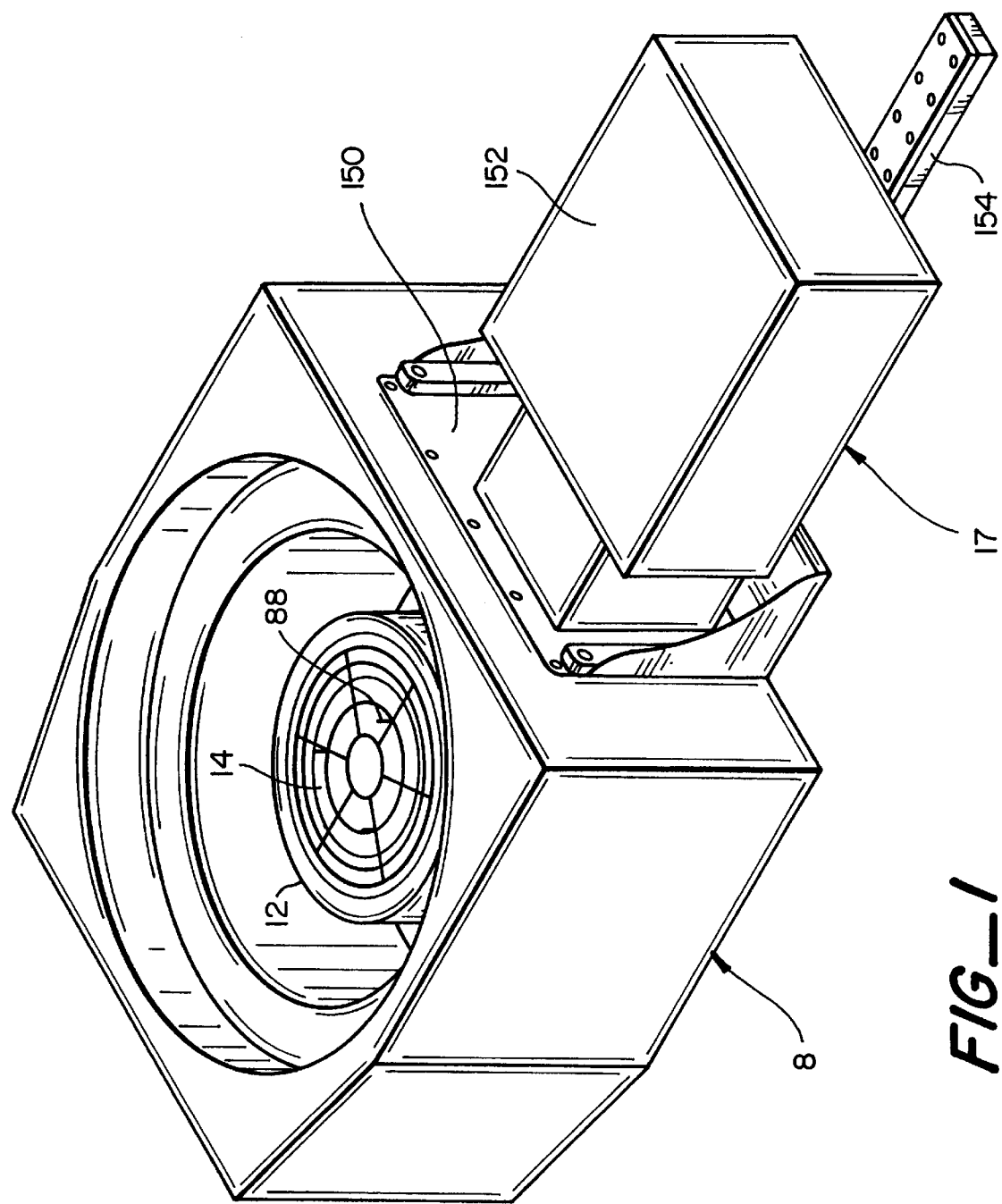

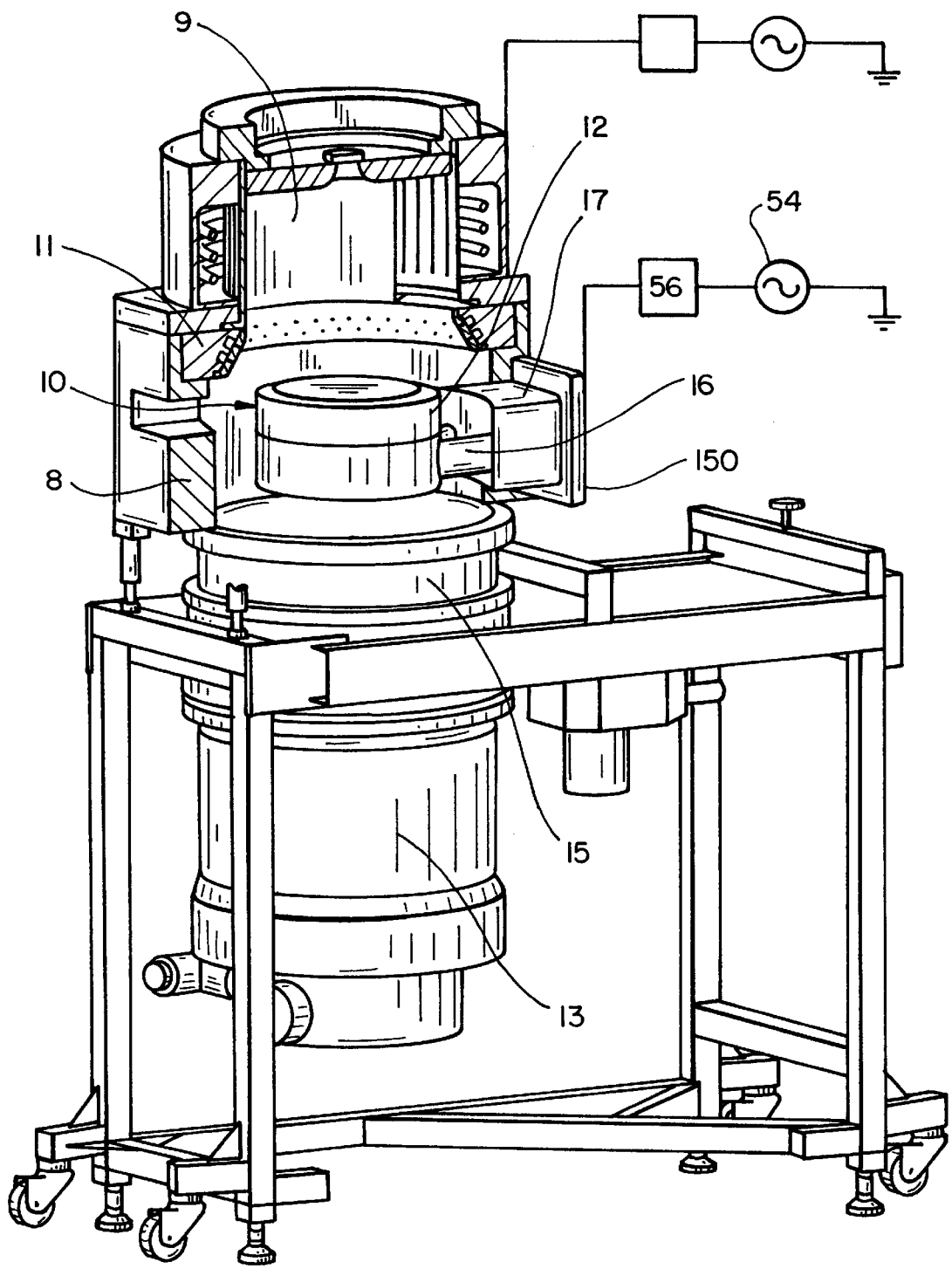
FIG_1A

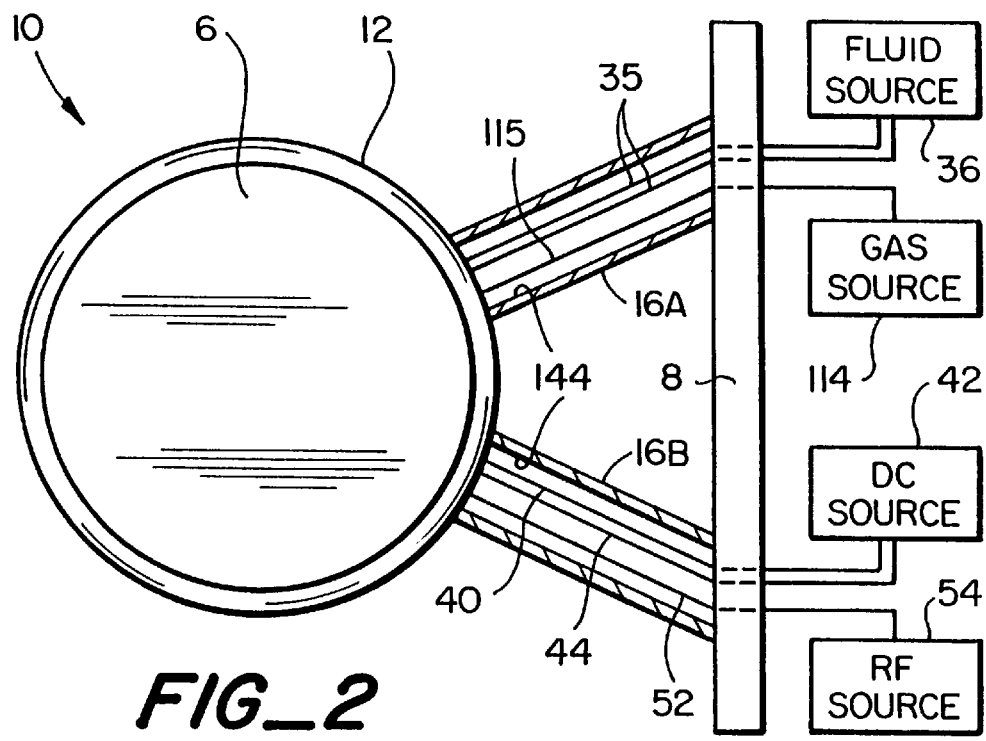
FIG_2
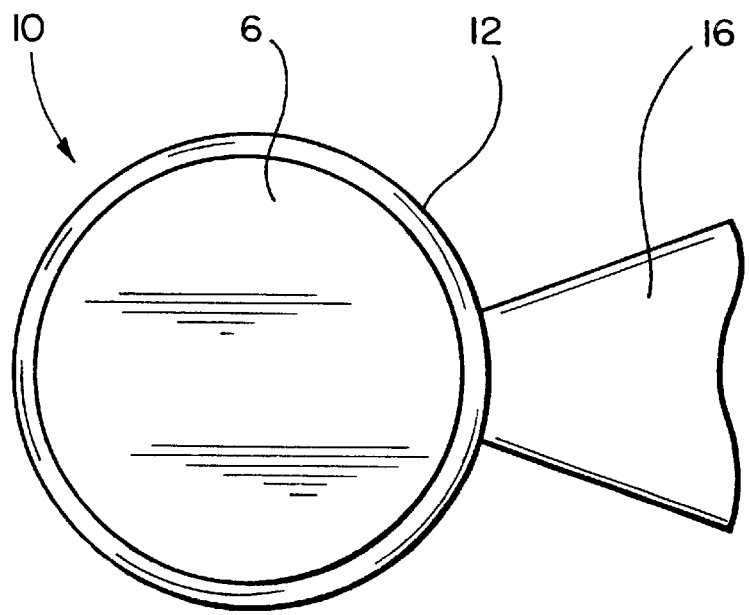
FIG_2A

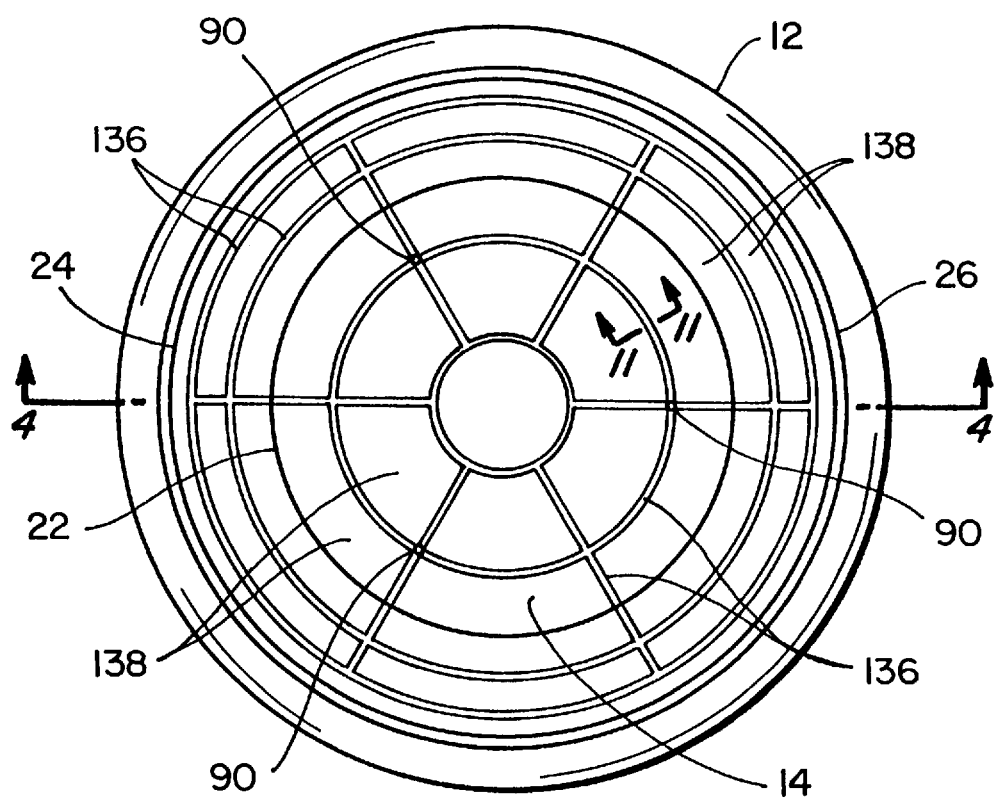
FIG_3

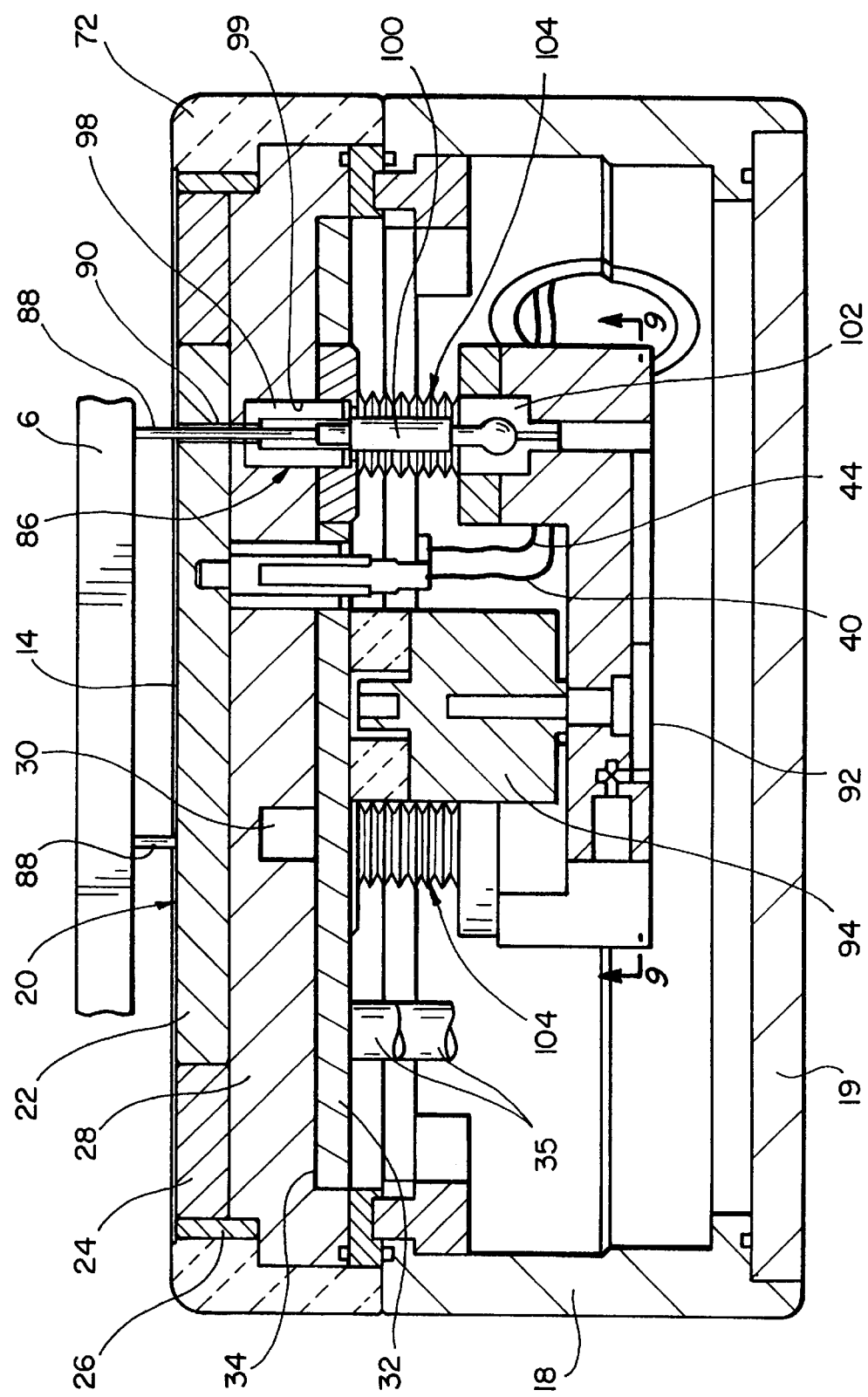
FIG_4

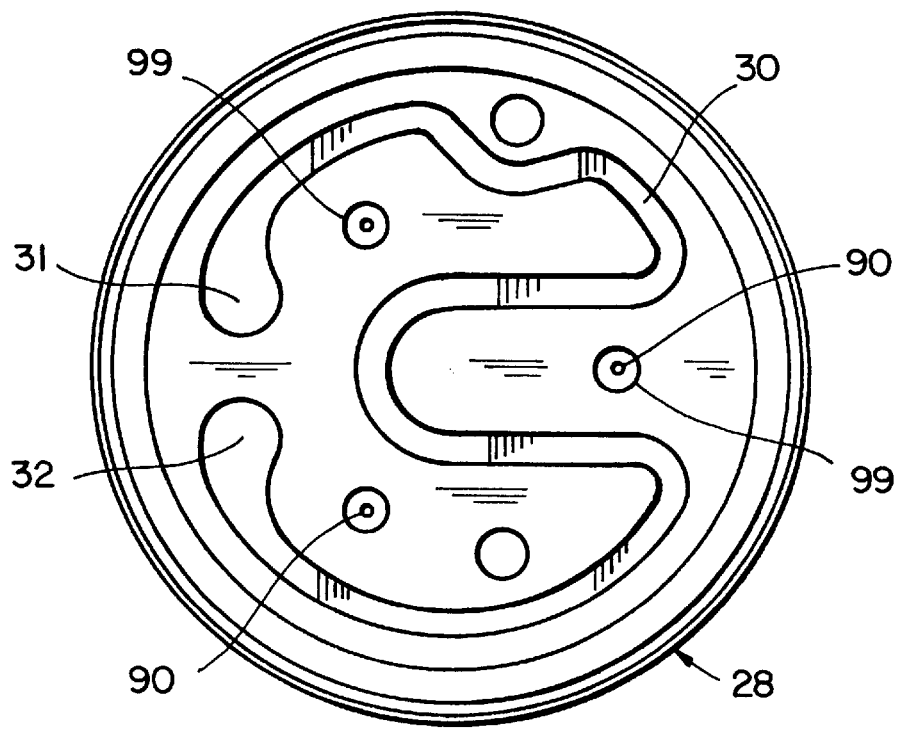
FIG_5
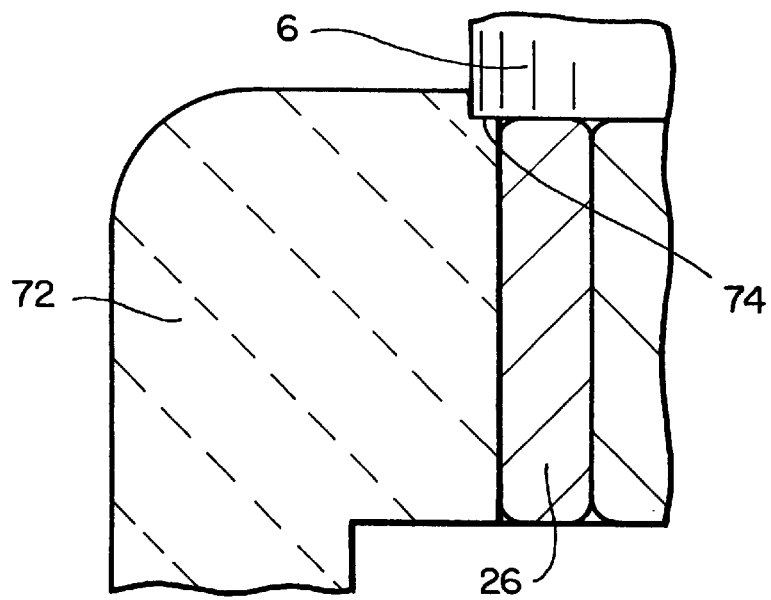
FIG_7

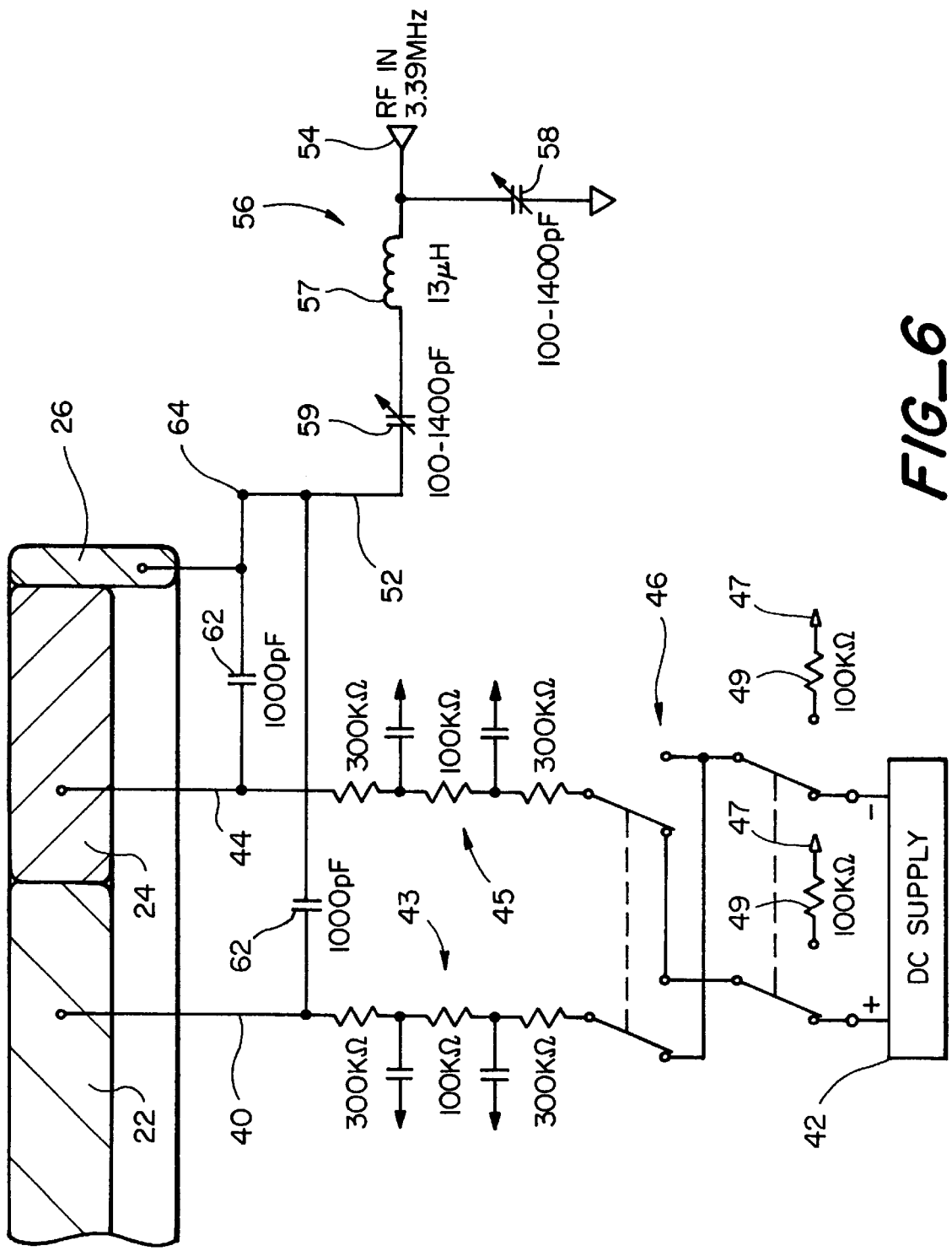
FIG_6

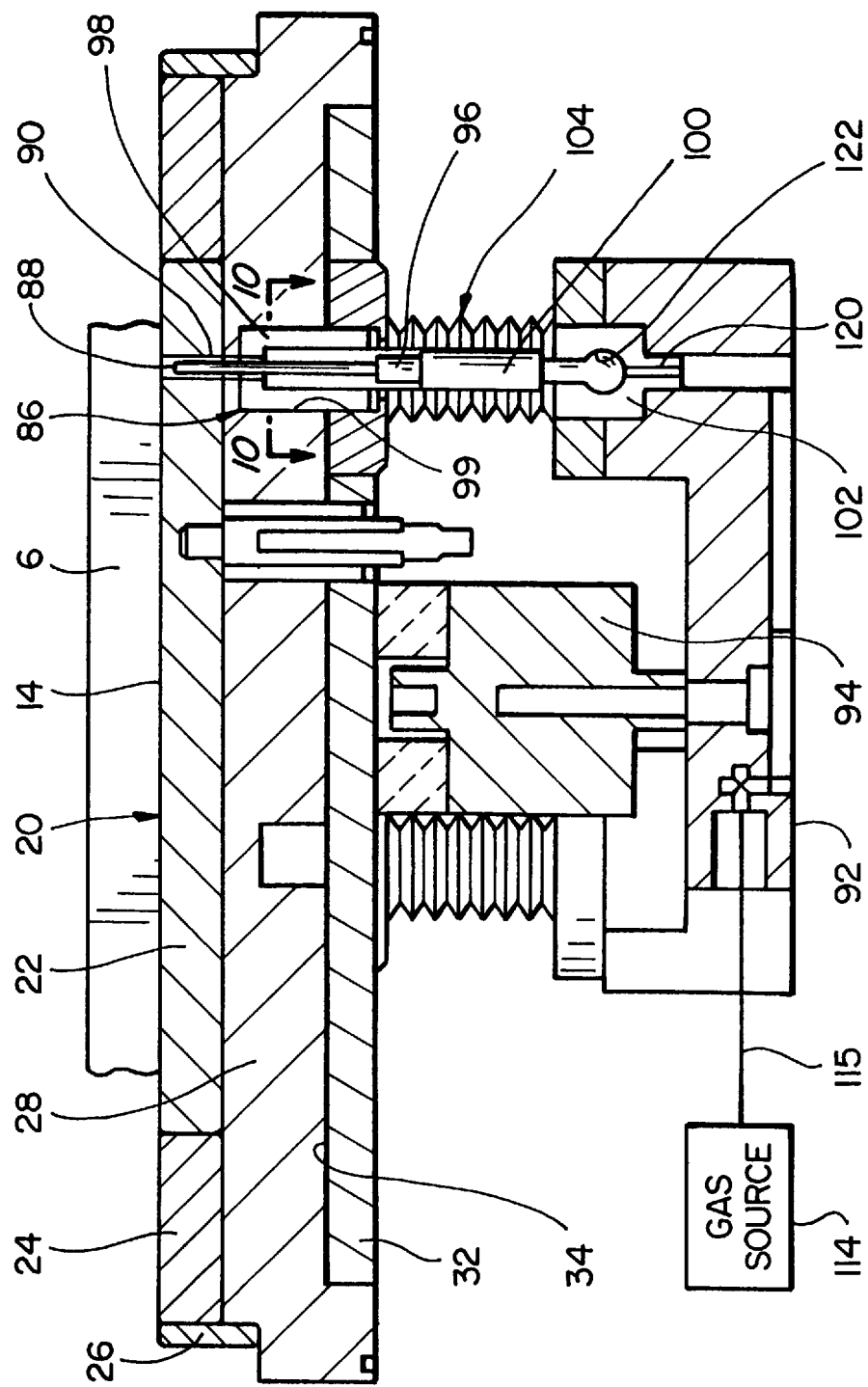
FIG_8

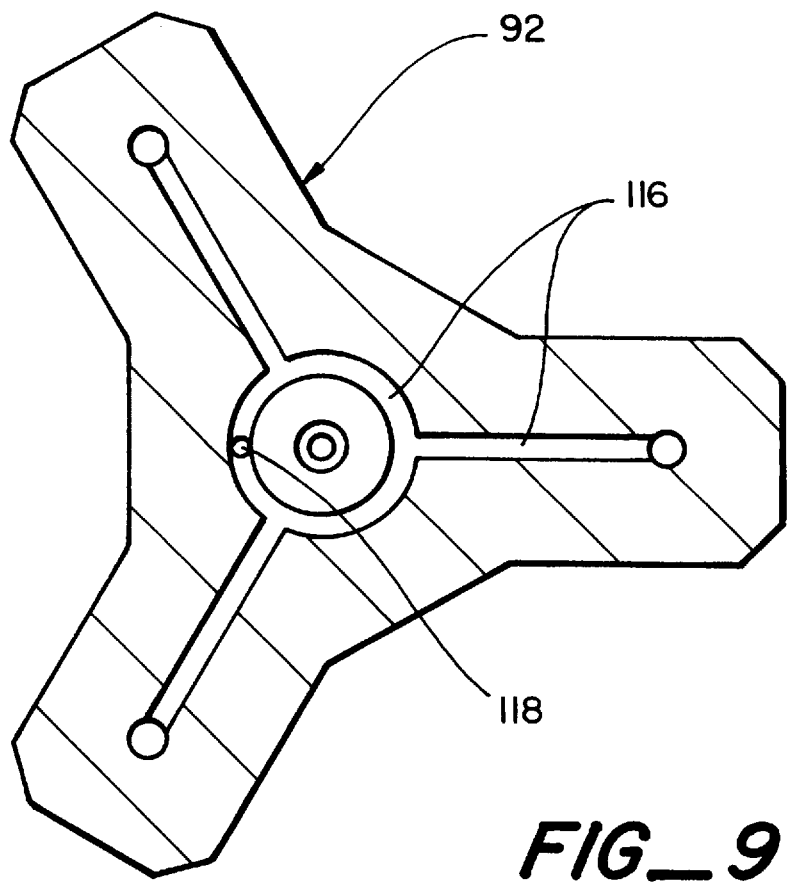
FIG_9
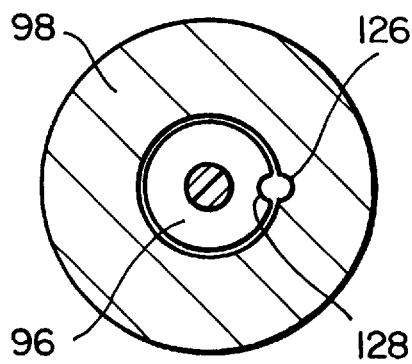
FIG_10
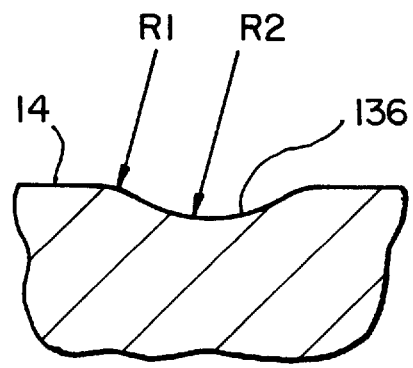
FIG_11

ELECTROSTATIC CHUCK ASSEMBLY

This is a continuation of application Ser. No. 08/500,480 filed Jul. 10, 1995, now U.S. Pat. No. 5,708,556.

BRIEF DESCRIPTION OF THE INVENTION

This invention relates in general to a method to hold down a conductive member onto a support surface without contacting the front or side surfaces of the conductive member, more particularly, to an electrostatic clamp for supporting a semiconductor wafer during processing.

BACKGROUND OF THE INVENTION

Various support systems have been employed to support a semiconductor wafer during chemical vapor deposition, sputtering, etching, and other processes. The support systems are often cooled in an attempt to maintain a substantially constant wafer temperature. Retaining the wafer at a constant temperature during processing is important for controlling the chemical process, obtaining process uniformity, and preventing damage to the integrated circuitry already formed on the wafer. The wafer is generally secured to the support to retain the wafer in position during processing and to improve heat transfer between the wafer and the support surface.

One type of support system employs a perimeter clamping ring which extends across the peripheral edge of the wafer to retain the wafer in place. The portion of the wafer beneath the ring is clamped tightly against the support surface. The clamping ring limits the total area available for circuit formation since the peripheral edge of the wafer is covered by the ring. The first side contact may introduce impurities to the wafewr. Another type of support system electrostatically clamps the wafer to the support surface. This is accomplished by applying a voltage to the support and inducing an image charge on the wafer. The different potentials attract the wafer to the support surface, tightly clamping the entire wafer to the support. The entire surface area of the wafer now becomes available for the formation of integrated circuits. In addition, there is no surface contamination.

Electrostatic support systems are typically supported on the bottom of the processing chamber. As a result, the system pump must be positioned at another location, for example to the side of the chamber. This configuration reduces uniformity of the flow of process gases throughout the chamber and increases the footprint of the overall system. Removing the wafer support system from the bottom of the chamber would allow the pump to be axially aligned with the wafer, improving uniformity and reducing the footprint of the processing system.

OBJECTS AND SUMMARY OF THE INVENTION

It is a primary object of this invention to provide an electrostatic support assembly for supporting a wafer during processing.

It is a further object of this invention to provide an electrostatic support system for supporting a wafer during processing at low pressures which provides for the uniform flow of process gases around the wafer.

It is another object of the invention to provide an electrostatic support assembly with a cooling system for efficiently maintaining a constant and uniform wafer temperature during processing.

It is yet another object of the invention to provide an electrostatic support assembly in which the wafer may be rapidly and efficiently removed from the support assembly.

A more general object of the invention is to provide an electrostatic support system which securely retains the wafer during processing while minimizing the risk of damage to the components on the exposed surface of the wafer from excessive heat, transient currents, and premature separation of the wafer from the support.

Another general object of the present invention is to provide an electrostatic support system which allows the entire surface of the wafer to be uniformly exposed to the process gases and which may be efficiently manufactured and operated.

In summary, this invention provides an electrostatic support assembly which is particularly suitable for retaining a wafer during processing. The support assembly generally includes a support body having a support surface for retaining the wafer, a voltage source coupled to the support body for electrostatically coupling the wafer to the support surface, and a cooling system for cooling the wafer. The cooling system includes a plurality of gas distribution grooves formed in the support surface which facilitate the rapid distribution of a gaseous substance between the wafer and the support surface. The cooling system includes a restriction mechanism in the conduit between the gas source and the gas distribution grooves to prevent catastrophic separation of the wafer from the support surface in the event a portion of the wafer becomes separated from the support surface. A plurality of arm members extending from the support body are mountable to the processing chamber with the support body and the arm members separated from the chamber bottom.

This invention also includes the method of supporting a wafer in a processing chamber which includes the steps of positioning the wafer on a wafer supporting surface of a support body having at least one electrode, applying a voltage to the electrode to induce the electrostatically attractive forces that hold the wafer to the support surface and, after processing the wafer, substantially grounding the electrode to sufficiently deactivate the electrostatic charge for release of the wafer from the support surface. In a preferred form of the invention, the support body includes two electrodes and the voltage applying step includes applying a positive voltage to one of the electrodes and a negative voltage to the other electrode. After the wafer is removed from the chamber, the polarity of the electrodes is reversed for the next wafer. In an embodiment of the invention employed in plasma-enhanced processes, the method also includes the step of applying an RF bias to the electrode or combination of electrodes.

Additional objects and features of the invention will be more readily apparent from the following detailed description and appended claims when taken in conjunction with the drawings.

BRIEF DESCRIPTION OF THE DRAWINGS

FIG. 1 is a schematic view of an electrostatic support system constructed in accordance with the invention, shown installed in a processing chamber.

FIG. 1A is an enlarged, partially broken away view of a reactor incorporating the electrostatic support system of FIG. 1.

FIG. 2 is a top view, partially broken away, of the electrostatic support system of FIG. 1, shown supporting a wafer.

FIG. 2A is a top view of another electrostatic support system.

FIG. 3 is a top view of the support surface of the electrostatic support system of FIG. 1.

FIG. 4 is a cross-sectional view taken substantially along line 4—4 in FIG. 3, shown with the lifting pins in an extended position supporting a wafer.

FIG. 5 is a bottom plan view of the base of the electrode assembly.

FIG. 6 is an enlarged schematic cross-sectional view, partially broken away, of the electrode assembly and DC and RF voltage supplies of the invention.

FIG. 7 is an enlarged cross-sectional view, partially broken away, of the ion focus ring and guard ring of the support body 12.

FIG. 8 is an enlarged cross-sectional view, partially broken away, of the lifting mechanism, shown with the lifting pins in the retracted position and a wafer positioned on the support surface.

FIG. 9 is cross-sectional view taken substantially along line 9—9 in FIG. 4.

FIG. 10 is a cross-sectional view taken substantially along line 10—10 in FIG. 8.

FIG. 11 is a cross-sectional view taken substantially along line 11—11 of FIG. 3.

DETAILED DESCRIPTION OF THE INVENTION

Reference is now made in detail to the preferred embodiment of the invention, which is illustrated in the accompanying figures. Turning now to the drawings, wherein like components are designated by like reference numerals throughout the various figures, attention is directed to FIGS. 1–2.

FIGS. 1 and 2 generally show an electrostatic support system or chuck assembly which is particularly suitable for retaining a wafer 6 in a processing chamber 8 during plasma-enhanced chemical vapor deposition, although the support system 10 may also be used with other types of processing including, but not limited to, chemical vapor deposition, sputtering, etching and the like. The support system 10 is particularly suitable for use with a high density, plasma enhanced chemical vapor deposition system of the type shown for example in FIG. 1A and disclosed in the co-pending application Ser. No. 08/500,493, incorporated herein by reference. The support system 10 includes a support body 12 with a support surface 14 for retaining a wafer and arm members 16 extending outwardly from the support body 12 for mounting the body to the chamber. In the present embodiment, arm members 16 are mounted to a carriage assembly 17, which is in turn releasably secured to the chamber 8. In FIG. 1A, the processing chamber 8 is positioned below a plasma assembly 9 and includes a gas injection manifold 11 mounted to the chamber 8 for injecting gaseous substances into the processing chamber. Below the chamber 8 is a vacuum pump 13 coupled to the chamber 8 by a port 15 which defines the bottom of the processing chamber. The support system 10 is suspended above the bottom of the process chamber, allowing the pump 13 to be substantially axially aligned with the process chamber. During operation, the entire wafer 6 is securely clamped to the support surface 14 by an electrostatic force. The uniform contact provided by the electrostatic clamping controls the heat transfer between the wafer 6 and the support surface 14 so that the entire wafer may be retained at the desired temperature throughout the processing. Maintaining the wafer at a uniform temperature is required for achieving the desired film properties for material deposition or uniform etch rates for removal of material.

Support body 12 includes an electrode assembly 20, shown particularly in FIGS. 4–7, which generally defines the support surface. The electrode assembly 20 is mounted to support base 18 having a removable cover 19 to provide access to the interior of support body 12 for maintenance and repair. Suitable seal members are provided at each junction.

The electrode assembly 20 includes an inner electrode 22, an annular outer electrode 24 and an annular guard ring 26 mounted to a base 28 which is electrically isolated from the electrodes, but not from the guard ring. The inner electrode 22, outer electrode 24 and guard ring 26 are coated with a dielectric material, electrically isolating the electrodes 22 and 24 from each other as well as the processing chamber. The peripheral edges of the electrodes 22 and 24 and guard ring 26 are preferably curved so that the dielectric coating may be uniformly applied, providing protection against arcing. In the present embodiment, the base 28 is formed of aluminum and coated with a high quality dielectric coating such as aluminum oxide. However, it will be understood that other means may be used for electrically isolating base 28 from the electrodes and the guard ring. A fluid channel 30 extends through the base and is enclosed by a cover plate 32 mounted to the base 28. As is shown particularly in FIG. 5, the channel 30 snakes across a substantial portion of the base 28 to provide uniform cooling and to avoid other components of the support body 12. The inlet 31 and outlet 33 of the channel are coupled via conduits 35 (FIG. 2) to a fluid source 36 for the circulation of a cooling fluid such as water or another suitable liquid through the channel. A gasket 34 is compressed between the base 28 and cover plate 32 to form a seal between the base and the cover plate and prevent leakage of the cooling fluid from the base 28.

The channel 30 provides a passageway through the base 28 for a cooling fluid such as water or another liquid through the base 28 for efficiently removing heat from the electrode assembly 20. The electrode assembly 20 of this invention is of particular advantage in that the electrodes 22 and 24 and guard ring 26 are electrically isolated from the grounding effects of the cooling fluid. Transporting the cooling fluid through the base 28 is preferred as heat may be rapidly removed, eliminating temperature gradients and preserving the planarity of support surface 14. However, in other modifications of the invention the electrode cooling system may be separate from the base 28 and electrodes 22 and 24. Furthermore, it can be used as a means to set the desired temperature of the assembly at a process defined temperature.

Electrode system 20 is used to electrostatically attract the wafer 6 to the support surface 14. As is shown particularly in FIG. 6, the electrode system 20 includes a first electrical connector 40 coupling the inner electrode 22 to a voltage source 42 through an RC filter 43 and a second electrical connector 44 coupling the outer electrode 24 to the voltage source 42 through an RC filter 45. The voltage source 42 applies a DC bias, with the polarity of the outer electrode 24 being opposite that of the inner electrode 22. The applied DC potentials on the electrodes 22 and 24 generate image charges on the back surface of the wafer and electrostatically attract the wafer to the support surface 14, securely clamping the wafer to the support surface. The polarity of the electrodes is reversed by activating gang switch 46 each time a wafer is removed from support surface 14 to minimize any residual charges or polarization in the dielectric coating which may interfere with the release of the wafer from the support surface.

The surface area of the inner and outer electrodes 22 and 24 is substantially equal, providing a uniform bipolar charge across the support system 10. When the support system 10 is used in plasma enhanced systems, the electrodes 22 and 24 are electrically floating with respect to the plasma to prevent leakage of current to the plasma. Electrodes 22 and 24 are preferably referenced by center tapping the electrodes to the guard ring 26, which substantially centers the DC potential around the potential induced in the wafer by the plasma. As a result, a constant potential is distributed across the support surface to maintain uniform clamping. In the present embodiment, where the support system 10 is used in plasma-enhanced processing systems, the wafer has a potential of about −300V, for a typical RF bias of 2000 watts. Centertapping the electrodes 22 and 24 to the guard ring 26 causes one electrode to have potential of +100V and the other electrode a potential of −700V when coupled to an 800V voltage source. If the electrodes were centertapped to ground, the potential of the electrodes would be non-uniform with respect to the biased wafer. If the voltage source has a sufficiently high impedance so that the power supply is fully floating from ground, center tapping the voltage source to the guard ring 26 will be unnecessary because the electrodes 22 and 24 will "self center" around the bias induced in the wafer, accommodating the desired uniform clamping.

The electrodes 22 and 24 preferably have substantially smooth, planar upper surfaces for improved temperature uniformity across the wafer to maintain the planarity of support surface 14. The increased stability provided by the planarity of the electrode surfaces is particularly important during high-density plasma enhanced processes where the film deposition is occurring at the high thermal loads of the wafer where thermal non-uniformities can cause stress in the wafer leading to wafer breakage. By preventing possible damage to the wafer, the electrode assembly substantially improves the efficiency of the processing system.

The electrostatic charge between the wafer 6 and the support surface 14 must be deactivated before the wafer may be safely removed from the support body 12. In a preferred embodiment, the electrodes 22 and 24 are discharged by switching the electrodes from the voltage supply 42 to 47 ground 47 through resistors 49 having a resistance of about 100 Ω. The resistors control the rate of discharge, preventing the development of voltage transients which may damage the components on the wafer surface. The application of any RF bias to the support system 10 is also discontinued. During this time, the plasma source of the processing system remains active causing any charge remaining in the wafer to drain. By effectively grounding the electrodes 22 and 24 and the wafer 6, the electrostatic field is removed and the wafer may be easily and safely removed from the support surface 14.

In the present embodiment, the support system 10 is particularly adapted for use with plasma-enhanced processing systems. Electrode assembly 20 includes means for applying an RF bias to the support body. As is shown particularly in FIG. 6, electrode assembly 20 includes an electrical connector 52 which couples the inner and outer electrodes 22 and 24, respectively, to an RF source 54 through a matching network 56. The self-induced bias created on the wafer by applying the RF bias to the support surface accelerates ions from the plasma sheath toward the wafer. These energized ions are required to prevent formation of voids during step coverage chemical vapor deposition.

The frequency of the RF bias applied to the support surface 14 is within the range of 450 kHz to 60 MHz. Preferably, the RF frequency of the plasma source is different from that of the chuck to minimize frequency beating. In the present embodiment, the frequency of the RF source 54 is approximately 3.39 MHz for a plasma source frequency of approximately 13.56 MHz.

A preferred matching network 56 is shown schematically in FIG. 6. The matching network 56 generally includes an inductor 57 and a pair of variable capacitors 58 and 59 coupled to the inductor 57 for phase matching the RF source 54 to the wafer 6 to change the RF delivery pattern to the wafer. The support body 12 has a well defined, capacitive inductance of about 4–7 Ω at 50° to 75° C. during the process. The range of the adjustable capacitors 58 and 59 and the inductor 57 have been designed such that, if no plasma is present, the match is out of range causing the RF generator to reduce its output level to prevent damage to the support assembly 10 due to excessive voltage in the unloaded resonant circuit. The inductor 57 has an iron powder core material for minimizing inductance loss. The high permeability of the powder reduces the number of turns which are required, improving the Q value and space requirements of the inductor. For an RF source frequency of about 3.39 MHz, the inductor 57 preferably has an inductance of about 13 $\mu$H. Matching network 56 is preferred as it offers an increase in efficiency of about fifty percent compared to standard systems. However, it is to be understood that in other modifications of the invention other types of matching networks may be employed.

In a preferred embodiment of the invention, the DC voltage source 42 and the RF bias source 54 are combined as shown in FIG. 6. Both sources 42 and 54 are coupled directly into the electrodes 22 and 24, with the DC voltage source 42 being tied to the same connection through an RC filters 43 and 45. Combining the DC source 42 and RF source 54 reduces the number of connections to the support body, minimizing the overall size required for the support body 12. This is of particular advantage with the present invention, where raising the support body 12 above the bottom of the chamber limited the amount of available space. Capacitors 62 positioned between the RF source 54 and the electrodes 22 and 24 control the ratio of the application of the RF bias to the inner electrode 22 and the outer electrode 24, providing an adjustment mechanism for obtaining a uniform RF distribution across the entire wafer for ensuring uniform processing on the wafer surface.

As is set forth above, the guard ring 26 may be coupled to the centertap of the DC voltage source 42 when support system 10 is used with plasma-enhanced processing systems to provide a uniform DC voltage across the wafer. In addition, the guard ring 26 may be tied to the RF source 54 to provide a means of further controlling the RF bias delivered to the wafer plane.

The guard ring 26 may be formed of an electrically conductive material such as aluminum. By tying the electrically conductive guard ring 26 to the RF source as shown for example in FIG. 6, a direct measurement of the induced wafer bias may be obtained at junction 64 when the electrical contact with the wafer is established.

Support body 10 includes an ion focus ring 72 which extends around the periphery of the electrode assembly 20 to protect the active electrodes from the plasma. The ion focus ring 72 is formed of a ceramic material or other suitable dielectric material. As is shown particularly in FIG. 7, the wafer extends across the guard ring 26 and a portion of the ion focus ring 72. In the present embodiment, the ion focus ring 72 includes an annular shoulder 74 for supporting the wafer so that the ion focus ring 72 at least partially protects the peripheral edge of the wafer from the plasma. Any plasma seeping between the wafer and the ion focus ring 72 will encounter the guard ring 26, which will effectively isolate the plasma from the active electrodes 22 and 24.

Wafer 6 is lowered onto and raised from support surface 14 by a wafer lifting assembly, generally designated 86. Lifting assembly 86 includes a plurality of lifting pins 88 which extend through apertures 90 formed in the support surface 14 and the electrode assembly 20. The lifting pins 88 are movable between the extended position shown in FIG. 4, with the pins 88 retaining the wafer 6 above the support surface 14, and the retracted position shown in FIG. 8. In the present embodiment, lifting mechanism 86 includes three lifting pins 88 (FIG. 1), the minimum number of pins required for evenly supporting wafer 6 as it is moved relative to the support surface. Pins 88 are located approximately halfway between the center and peripheral edge of the wafer. Although using a minimum number of pins is preferred, it is to be understood that the number and position of pins 88 and apertures 90 may be varied as desired.

In the present embodiment, the three lifting pins 88 are carried by a yoke member 92. The yoke member 92 is moved back and forth relative to the support surface 14, moving the lifting pins 88 between the extended and retracted positions shown in FIGS. 4 and 8, by an actuator 94 disposed between the electrode assembly 20 and yoke member 92. Movement of the lifting pins 88 is synchronized with the yoke member 92, ensuring the wafer 6 is retained in a substantially horizontal orientation as it is moved by the lifting pins 88. The actuator 94 of the present embodiment is provided by a pneumatic cylinder, although it will be understood that other actuating means may also be used to raise and lower the yoke member 92.

As is shown particularly in FIG. 8, lifting pin 88 is mounted to a collar 96. In the present embodiment, collar 96 is preferably formed of a plastic material for increased compliance and reduced friction as the pin 88 is moved between the retracted and extended positions. The lifting pin 88 and collar 96 extend through the longitudinal bore of a bearing 98. In the present embodiment, the bearing 98 is positioned in an opening 99 formed in the base 28 of the electrode assembly 20. A shaft 100 couples the collar 96 to a socket 102 carried by the yoke member 92. The collar 96, shaft 100 and socket 102 are surrounded by a bellows assembly 104 which is mounted to the electrode assembly 20 and the yoke member 92. Suitable seal rings are compressed between bellows assembly 104 and the electrode assembly and yoke member. The bellows assembly 104 expands and contracts and the yoke member 92 is raised and lowered relative to the electrode assembly 20. As is described in more detail below, the lifting mechanism 86 of the present invention is of particular advantage in that it cooperates with the wafer cooling system in the delivery of a gaseous substance to the support surface 14. It will be understood that the various components of the lifting mechanism 86 may be varied within the scope of the present invention. Moreover, it will be understood that in other modifications of the invention, support system 10 may employ different mechanisms for removing the wafer 6 from the support surface.

Support system 10 employs a gaseous cooling system for cooling the wafer during processing. A non-reactive gaseous substance, such as helium, argon, oxygen, hydrogen and the like, is distributed between the support surface 14 and the wafer 6 to provide substantially uniform cooling across the entire wafer. Maintaining the entire wafer at a uniform temperature during processing significantly improves the uniformity of the layers formed on the wafer surface.

In the present embodiment, the gaseous substance is delivered through the lifting mechanism 86 to the support surface 14. The gas source 114 is coupled to the yoke member 92 of the lifting mechanism via conduit 115. The yoke member 92 is formed with a channel network 116, shown particularly in FIG. 9, for distributing the gaseous substance between the three lifting pins 88. The gaseous substance enters through a gas inlet 118 and travels through the channel network 116 along the legs of the yoke member 92 to socket 102. The socket 102 has a hole 120 formed therein which extends inwardly to the interior cavity 122 of the socket. The shaft 100 fits loosely within the socket cavity 122, providing a passageway for the gaseous substance between the shaft 100 and the socket 102. The gaseous substance flows upwardly around the shaft 100 into the interior of the bellows assembly 104. From the bellows assembly 104, the gas flows between the collar 96 and the bearing 98 and upwardly through the aperture 90 formed in the electrode assembly 20 to the support surface 14. The apertures 90 extending through the electrode assembly 20 are coated with a dielectric material to isolate the DC voltage from the gaseous substance. Preventing exposure of the gaseous substance to the DC voltage is of particular importance to prevent arcing.

Transporting the gaseous substance through the lifting assembly 86 is of particular advantage in that the number of holes formed in the electrodes is minimized. This is particularly desirable in that it improves the reliability of the electrode assembly 20 by minimizing areas of possible arcing when the support system 10 is used in a plasma-enhanced processing system. Minimizing the number of holes also reduces the manufacturing costs of the support body 12. The apertures 90 are particularly suitable for uniformly delivering gas to the support surface 14 because of the symmetrical arrangement of lifting pins 88 and apertures 90.

The cooling system of the present invention includes means for preventing catastrophic separation of the wafer 6 from the support body 12 during processing. As is shown particularly in FIG. 10, the outer diameter of the collar 96 of the lifting pin 88 is substantially equal to the inner diameter of the longitudinal bore of the bearing 98. A longitudinally-extending shallow groove 126 formed in the interior wall of the bearing 98 and a longitudinally-extending shallow groove 128 on the exterior of the collar 96 provide a conduit for the gaseous substance between the bellows assembly 104 and the apertures 90. Although the grooves 126 and 128 are substantially aligned in the present embodiment, the grooves 126 and 128 may also be circumferentially spaced relative to one another if desired. The shallow grooves 126 and 128 provide a restriction which significantly reduces the flow rate of the gaseous substance. The restriction divides the gas flow path into a first plenum between the gas source 114 and the bearing 98 and a second plenum between the bearing and the support surface, with the second plenum containing only a fraction of the available gas to reducing the amount of available gas proximate the support surface 14.

In some instances, the electrostatic charges between the wafer and the support surface may be partially disrupted during processing. In the event a portion of the wafer becomes separated from the support surface, the gas in the second plenum will bleed through the resulting gap into the processing chamber. If the entire gas supply was exposed to the support surface, the pressure would cause the wafer to be forced from the support surface 14. This catastrophic separation of the wafer from the support surface is prevented because of the limited volume of gas in the second plenum.

After the gaseous substance in the second plenum has escaped, the wafer is free to fall back against the support surface and become reattached to the support body. With the restriction provided by the shallow grooves 126 and 128, possible damage to the wafer because of partial loss of the electrostatic charge is substantially eliminated.

In the present embodiment, the restriction is provided by the shallow groove 126 formed in the interior of the bearing 98 and the shallow groove 128 formed on the exterior of the collar 96. However, it is to be understood that the position of the restriction relative to the support surface may be varied if desired. Moreover, other means may be used to restrict the flow of gas between the gas source 114 and the support surface 14 within the scope of the present invention. Because of the restriction, additional time is required for the second plenum and the space between the wafer and the support surface 14 to fill with gas. As a result, the wafer may quickly reach the desired processing temperature. Another advantage of the restriction is that it provides a capillary feed which prevents arcing in the event you have a high potential difference between the support surface 14 and the lifting mechanism 86.

Although not shown, with the support body of the present invention, the gaseous substance used for cooling the wafer during processing may also be used to raise and lower the lifting pins 88. In the modified embodiment, the lifting pins 88 are carried by a suitable support structure and coupled to a spring. The pressure of the gaseous substance and the springs control movement of the lifting pins between the extended and retracted positions shown in FIGS. 4 and 8.

The support surface 14 of the present invention includes means for uniformly distributing the gaseous substance across the entire wafer. As is shown particularly in FIG. 3, a plurality of gas distribution grooves 136 are formed in the support surface 14. In the present embodiment, the location of the apertures 90 coincide with the grooves so that the gas is fed directly into the gas distribution grooves. The gas then flows through the grooves and into the spaces between the rear surface of the wafer and the support surface 14. The grooves 136 preferably divide the support surface 14 into a plurality of segments 138, with the total surface area of each of the segments being substantially equal. In the present embodiment, the groove configuration includes six radially extending grooves positioned at sixty degree intervals around the circumference of the wafer and five circumferentially extending grooves. When the support body 12 is used to retain an eight inch wafer, the segments 138 each have a surface area of about 1.5 to 2.5 square inches, for example two square inches. However, it will be understood that a greater or lesser segment surface area is within the scope of the present invention. The configuration of the gas distribution grooves 136 provides for a substantially uniform distribution of gas across the entire support surface so that the wafer may be subjected to uniform cooling throughout the process.

The configuration of the grooves is of particular importance to avoid ignition of the gaseous substance due to the existence of potential between the wafer and the electrode especially in plasma-enhanced systems. The width of the groove measures approximately 0.031 to 0.125 inches, preferably about 0.062 inches, while the maximum depth is approximately 0.010 to 0.031 inches, preferably about 0.015 inches. As is shown particularly in FIG. 11, the grooves 136 are curved. The edges of the grooves have a radius of curvature R1 in the range of 0.031 to 0.062 inches while the radius of curvature R2 of the grooves is in the range of 0.031 to 0.093 inches. In the present embodiment, the outer groove edges preferably have a radius of curvature of about 0.045 inches while the radius of curvature of the groove is about 0.062 inches. With these dimensions, ignition of the helium employed in the present embodiment is substantially avoided.

With the support system 10 of the present invention, arm members 16 mount the support body 12 to the processing chamber with the support body spaced from the bottom of chamber as is shown for example in FIG. 1A. Removing the support body 12 from the bottom of the chamber offers increased flexibility in the design of the overall processing system. For example, the pump (not shown) may be axially aligned with the support body 12, minimizing the footprint of the overall system and improving the effectiveness of the pump during processing. In the present embodiment, support system 10 includes two arms 16A and 16B extending toward one wall of the processing chamber 8. However, it is to be understood that the number of arms may be increased or, if desired, only one arm member may be used as is shown for example in FIG. 2A. Using a plurality of arm members offers several advantages, including increased stability and reduced size. The reduced diameter of the arm members 16 reduces the amount of interference with the symmetry of the flow of gases to the pump. This is particularly important for pressure sensitive applications. In the present embodiment, arm members 16A and 16B are mounted to one wall of the chamber 8 as is shown in FIG. 2. However, it is to be understood that the arm members may also extend toward the corners of the processing chamber or to different chamber walls if desired.

Arm members 16 are each formed with a longitudinally extending bore 144. As is schematically illustrated in FIG. 2, the bore of one of the arm members 16A provides a conduit from the support body 12 for the electrical connectors 40 and 44 coupling the electrodes 22 and 24 to the voltage source and the electrical connector 52 coupling the RF source 54 to the electrodes. The gas source 114, the fluid source 36 for the electrodes assembly 20 are connected to the support body 12 through conduits 115 and 35, respectively, which extend through the bore 144 of the other arm member 16B. Although not shown, the pneumatic lines for operating the actuator 94 also extend through the bore 144 of the arm member 16B. By using two arm members 16, the electrical components are safely separated from the liquid cooling fluid as well as the gaseous substance used to cool the wafer.

As is shown in FIGS. 1 and 1A, in the present embodiment arm members 16A, 16B are preferably mounted to a support plate 150 of carriage structure 17. The support system 10 is installed by inserting the support body 12 and arm members 16 through an opening formed in the chamber wall and securing the support plate 150 to the exterior of the chamber with suitable fasteners. The support body 12 may be conveniently removed by disengaging the support plate 150 from the chamber exterior and pulling the entire unit from the chamber. A housing 152 mounted to the opposite side of the support plate 150 encloses components of the support system 10 such as RF/DC combiner, match network and DC supply. Coupling members (not shown) couple the fluid source 36 for cooling the electrode assembly 20 and the gas source 114 for cooling the wafer 6 to the conduits 35 and 115, respectively. A track structure 154 supports the support plate 150 and housing 152, facilitating movement of the support plate 150 for insertion of the support body 12 into or removal of the support body from the chamber.

With carriage assembly 17, support body 12 may be efficiently and conveniently positioned in and removed from the processing chamber. The carriage assembly 17 improves the accessibility of the chamber for maintenance and clean-up of a fractured wafer. Manufacture of the processing chamber is simplified as the arm members 16 may be mounted to the carriage structure and the necessary connections completed outside of the processing chamber. Although use of the carriage assembly 17 is preferred, it is to be understood that the assembly may be omitted and the arm members 16 mounted directly to the chamber wall.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the claims appended hereto and their equivalents.

What is claimed is:

1. An electrostatic support system for retaining a wafer in a processing chamber having a chamber wall and a bottom, said support system comprising:

a body portion having a support surface for retaining said wafer, at least one arm member extending between said body portion and the chamber wall for supporting said body portion in the processing chamber with said body portion spaced inwardly from the chamber wall and said body portion and said at least one arm member spaced above the bottom of the chamber, said at least one arm member having at least one longitudinally extending passageway formed therein, said at least one passageway extending between said body portion and the chamber wall, and an electrostatic system for applying a charge to said support surface for electrostatically coupling said wafer to said support surface, said electrostatic system including at least one electrode carried by said body portion and at least one electrostatic electrical connector positioned in electrical contact with said electrode, said electrostatic electrical connector being positioned in said at least one passageway formed in said arm member such that said electrostatic electrical connector is substantially isolated from said chamber.

2. The support system of claim 1, and further comprising a carriage assembly for mounting said electrostatic support system to the wall of the processing chamber, said at least one arm member being mounted to said carriage assembly.

3. The support system of claim 1, and further comprising a biasing system for applying an RF bias to said body portion.

4. The support system of claim 3 in which said biasing system includes at least one biasing electrical connector positioned in said at least one passageway formed in said arm member such that said biasing electrical connector is substantially isolated from the chamber.

5. The support system of claim 1, and further comprising a wafer cooling system for cooling said wafer.

6. The support system of claim 5 in which said wafer cooling system includes at least one coolant passageway extending through said body portion for circulating a cooling fluid therethrough and at least one conduit coupled to said coolant passageway, said conduit being positioned in said at least one passageway of said arm member such that said coolant passageway is substantially isolated from the chamber.

7. The support system of claim 6 in which said conduit and said electrostatic electrical connector extend through separate passageways.

8. The support system of claim 1 in which said body portion includes at least one lifting member movable relative to said support surface between an extended position with said lifting member extending through a hole in said support surface for supporting said wafer above said support surface and a retracted position with said lifting member retracted beneath said support surface.

9. An electrostatic substrate support system mountable in a processing chamber having a chamber wall and a bottom, said support system comprising:

a body portion having a support surface for retaining the substrate and at least one coolant passageway formed therein for circulating a coolant fluid through said body portion;

at least one electrode carried by said body portion for electrostatically coupling the substrate to said support surface;

at least one arm member coupled to said body portion, said at least one arm member extending between said body portion and the chamber wall for supporting said body portion in the processing chamber with said arm member and said body portion spaced above the bottom of the chamber;

first and second passageways extending through said at least one arm member between said body portion and the chamber wall, said first passageway housing at least one electrostatic electrical connector for coupling said at least one electrode to a voltage source outside of the chamber and said second passageway housing conduits for coupling said coolant passageway to a coolant source outside of the chamber.

10. The support system of claim 9 in which said body portion includes a gas delivery network for delivering a gaseous substance to said support surface, and said second passageway housing at least one gas delivery conduit for coupling said gas delivery network to a gas source outside of the chamber.

11. The support system of claim 9 in which said first passageway houses at least one biasing electrical connector for coupling said electrode to a biasing source for applying an RF bias to said body portion.

12. The support system of claim 9 in which two arm portions are coupled to said body portion, said first passageway being formed in one of said two arm portions and said second passageway being formed in the other of said two arm portions.

13. The support system of claim 9, and further comprising a carriage assembly for mounting said support system to the chamber wall, said at least one arm member being mounted to said carriage assembly.

* * * * *